United States Patent
Putzeys

(10) Patent No.: US 7,113,038 B2
(45) Date of Patent: Sep. 26, 2006

(54) POWER AMPLIFIER

(75) Inventor: Bruno Johan Georges Putzeys, Herent (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 37 days.

(21) Appl. No.: 10/511,371

(22) PCT Filed: Apr. 1, 2003

(86) PCT No.: PCT/IB03/01253

§ 371 (c)(1),
(2), (4) Date: Oct. 14, 2004

(87) PCT Pub. No.: WO03/090343

PCT Pub. Date: Oct. 30, 2003

(65) Prior Publication Data

US 2005/0162228 A1    Jul. 28, 2005

(30) Foreign Application Priority Data

Apr. 19, 2002    (EP) .................................. 02076543

(51) Int. Cl.
*H03F 3/217* (2006.01)
(52) U.S. Cl. .................................. 330/251; 330/207 A
(58) Field of Classification Search .................. 330/10, 330/251, 207
See application file for complete search history.

(56) References Cited

U.S. PATENT DOCUMENTS

| 4,415,863 A | 11/1983 | Tokumo |
| 5,722,052 A | 2/1998 | Abdi et al. |
| 5,955,899 A * | 9/1999 | Afghahi ........................ 327/65 |
| 6,118,336 A * | 9/2000 | Pullen et al. .................. 330/10 |
| 6,297,692 B1 | 10/2001 | Nielsen |
| 6,441,685 B1 * | 8/2002 | MacMillan ................... 330/10 |
| 2002/0008574 A1 | 1/2002 | Mathe et al. |

FOREIGN PATENT DOCUMENTS

| EP | 0655830 A1 | 5/1993 |
| EP | 1049247 A1 | 11/2000 |
| FR | 1602588 A | 12/1970 |

* cited by examiner

*Primary Examiner*—Robert Pascal
*Assistant Examiner*—Hieu Nguyen
(74) *Attorney, Agent, or Firm*—Edward W. Goodman; Paul Im

(57) ABSTRACT

A switching power amplifier of class D has a switching stage for generating a block wave signal by alternately switching the block wave signal between supply voltages. A filter (24, 25) generates a power output signal (22) corresponding to an input signal to be amplified, which is coupled to a linear input (19) that is free of hysteresis. A control circuit (27, 28, 29) provides feedback between the output power signal and the linear input for controlling both the gain in the operational frequency range and also the alternately switching of the switching stage. Hence, the amplifier oscillates controlled via the same feedback loop that also controls the operational behavior of the amplifier, resulting in low output impedance and low distortion.

10 Claims, 4 Drawing Sheets

POWER AMPLIFIER

BACKGROUND OF THE INVENTION

1. Field of the Invention

The invention relates to a power amplifier for amplifying an electric signal in an operational frequency range, the power amplifier comprising switching means for generating a block wave signal by alternately switching the block wave signal to a first supply voltage or a second supply voltage, filter means for generating a power output signal by low-pass filtering the block wave signal, input means for receiving the electric signal and driving the switching means, and a control circuit coupled to the output power signal and the input means for controlling the power amplifier.

2. Description of the Related Art

A switching power amplifier is known from U.S. Pat. No. 6,297,692. This patent describes pulse modulation amplifiers, also called pulse-width modulation amplifiers or class D amplifiers. In such amplifiers, there is an input stage for receiving an electrical input signal to be amplified, a modulating/switching stage and a filter. The modulating/switching stage generates a block wave signal having a frequency that is much higher than the highest frequency in the operational frequency range of the electric signal to be amplified. The pulse-width ratio of the block wave is modulated so that the average value of the block wave signal is proportional to the input signal. The filter filters the block wave signal to a power output signal. The modulation frequency may be derived from an oscillator, or the amplifier may be self-oscillating. Further, the power amplifier comprises a control circuit. For achieving a high quality power output signal, the control circuit has to control the amplifier in order to compensate numerous non-ideal features of the components of the class D amplifier. Several prior art options for such control circuits are described, and a cascaded control circuit is proposed in the above U.S. patent. The control circuit has a first feedback loop from the output power signal to the input for controlling the operational frequency behavior of the amplifier. The oscillation is controlled by a second feedback circuit coupled between the block wave signal and an input of the modulation circuit. The cascaded control circuit is complicated and requires both feedback circuits to be designed and tuned accurately.

SUMMARY OF THE INVENTION

It is an object of the invention to provide a power amplifier of high quality which has a less complicated structure.

For this purpose, the power amplifier as described in the opening paragraph, is characterized in that the control circuit is connected between the power output signal and a linear input of the input means for controlling both the gain in the operational frequency range and also said alternately switching of the switching means, said linear input being substantially free of hysteresis. The measures have the advantage that a low output impedance of the amplifier is achieved, even at the filter resonance frequency. Further, a large reduction of inductor-related distortion and a very wide loop bandwidth are achieved, resulting in substantially frequency-independent distortion figures.

The invention is also based on the following recognition. In some prior art switching amplifiers, self-oscillation is based on the hysteresis of an element in the input stage. Although such "hysteresis-controlled" oscillating amplifiers may appear relatively uncomplicated, Applicant has seen that such hysteresis results in a number of non-linear errors and distortion products. Further, the switching frequency may vary with modulation index, limiting the modulation swing. Efforts by other researchers concentrated on controlling the hysteresis voltage to reduce frequency modulation. Applicant has seen that in a hysteresis-free amplifier according to the invention, a combined feedback loop for both gain and oscillation control can be connected between the output power signal after the filter and the linear input. In addition to the advantages described above, this allows a significantly larger modulation swing before the switching frequency becomes unacceptably low.

In an embodiment of the power amplifier, the switching means comprises a first switching unit for switching to the first supply voltage and a second switching unit for switching to the second supply voltage, and the input means comprises a voltage comparator having complementary current outputs for respectively driving the first and second switching units. This has the advantage that due to the symmetrical construction of the circuit, distortion products in the output signal are kept low. In an embodiment of the power amplifier, the voltage comparator comprises a difference amplifier and a switching current mirror providing said complementary current outputs. A result of this is that none of the transistors in this circuit are used in saturation, insuring fast reaction speeds.

In an embodiment of the power amplifier, the switching means comprises a first switching unit for switching to the first supply voltage and a second switching unit for switching to the second supply voltage, both switching units being substantially identical. This has the advantage that due to the symmetrical construction of the circuit, distortion products in the output signal are kept low.

BRIEF DESCRIPTION OF THE DRAWINGS

These and other aspects of the invention will be apparent from and elucidated further with reference to the embodiments described, by way of example, in the following description and with reference to the accompanying drawings, in which.

Corresponding elements in different Figures have identical reference numerals.

DESCRIPTION OF THE PREFERRED EMBODIMENTS

Figure 1:
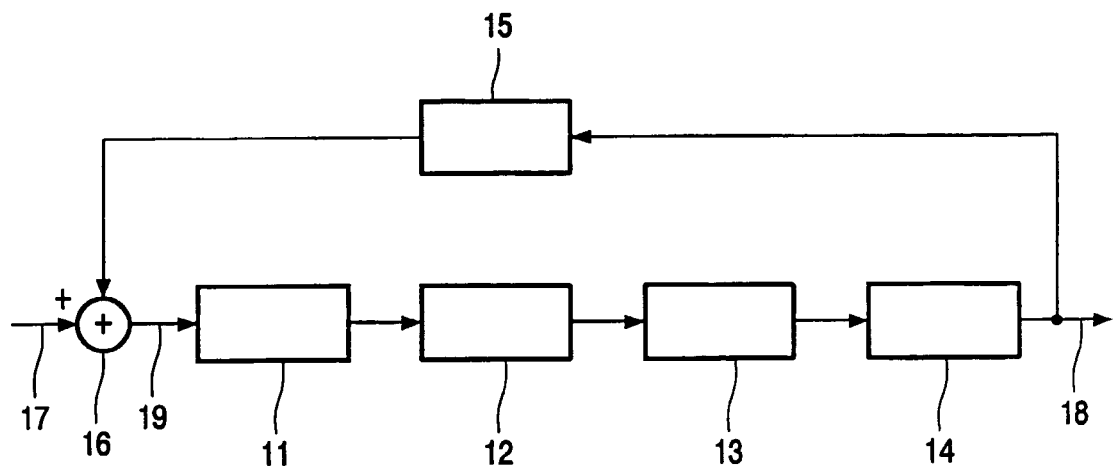
FIG. 1 shows a block diagram of a switching power amplifier.

FIG. 1 shows a block diagram of a switching power amplifier. The amplifier has an input circuit 11 which receives a signal from a summing node 16 at a hysteresis-free input 19. The input circuit 11 is coupled to a driver element 12 for driving a switching power stage 13. The output of switching power stage 13 is a block wave signal having a frequency well above the operational frequency range of the electrical signal to be amplified. The block wave signal is coupled to a low-pass filter 14, which removes the high frequency block wave and results in a power output signal 18. A control circuit 15 provides a feedback loop from the power output signal 18 to the summing node 16 at the input. The summing node further receives the electrical input signal 17 which is to be amplified. Some delay is present in the elements 11, 12, 13 of the amplifying chain due to the physical nature of the circuits used, e.g., semiconductors. The control circuit 15 is provided with oscillation feedback elements having a high feedback, i.e., a low impedance, at a high frequency. Due to the delay and the phase shift caused by the filter and the oscillation feedback elements in control circuit 15, the amplifier will be self oscillating at a high frequency. The control circuit 15 also has operational feedback elements for controlling the gain and characteristics of the power amplifier in the operational frequency range.

Figure 2:
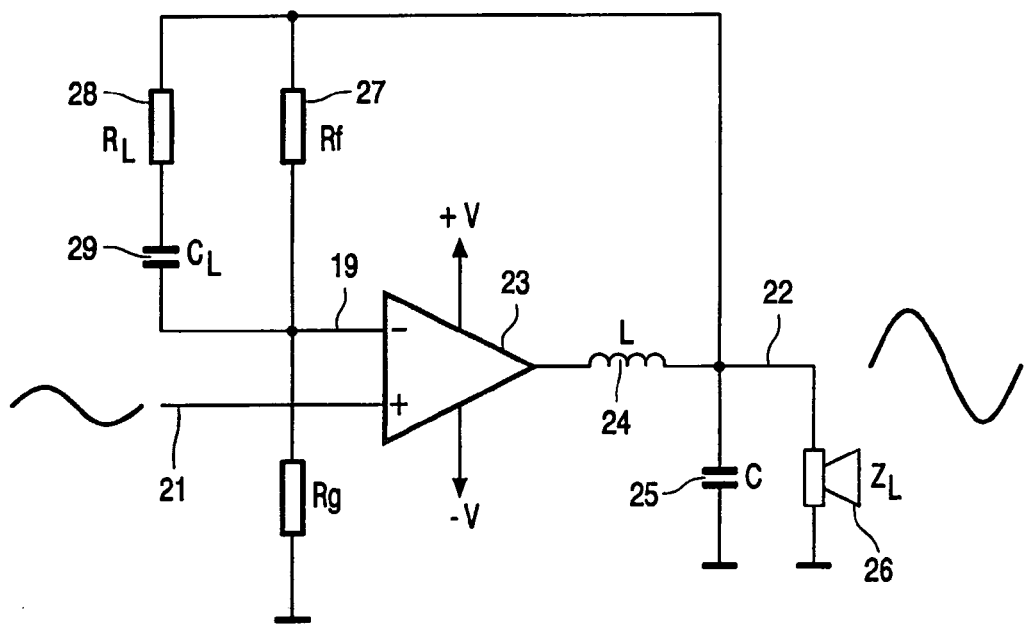
FIG. 2 shows an electrical diagram of a switching power amplifier.

FIG. 2 shows an electrical diagram of the switching power amplifier. The amplifier has an amplifier circuit 23 having a differential input stage, e.g., a positive input and a negative input of a comparator. The inputs are free of hysteresis. The positive input receives an electrical input signal 21 to be amplified. The amplifier circuit 23 comprises driver elements and a switching power stage. The output of switching power stage is a block wave signal which has a frequency well above the operational frequency range of the electrical signal to be amplified. The block wave signal is coupled to a low-pass filter, constituted by an inductor 24 and a capacitor 25, which removes the high frequency block wave and results in a power output signal 22. The power output signal 22 is connected to a load 26, e.g., a loudspeaker having an impedance $Z_L$, this load not being part of the amplifier. A control circuit provides a feedback loop having a feedback function H from the power output signal 22 to the negative input of the amplifier circuit 23. The negative input of the amplifier circuit 23 is connected to ground via a resistor $R_g$. The control circuit is provided with oscillation feedback elements having a high feedback at a high frequency, i.e., a resistor $R_L$ 28 in series with a capacitance $C_L$ 29. The control circuit also has an operational feedback element resistor $R_f$ 27 for controlling the gain and characteristics of the power amplifier in the operational frequency range. Due to delay in the amplifier circuit and the phase shift caused by the filter and the oscillation feedback elements in control circuit, the amplifier will be self oscillating at a high frequency.

The oscillation condition is met when the total phase shift of the loop gain is 360°, for the small-signal gain of the combined comparator and power stage is undefined but sufficiently large. The feedback function H can be written as:

$$H(s) = \frac{1 + \tau_b \cdot s}{(1 + \tau_b \cdot s) + A_n \cdot (1 + \tau_a \cdot s)}$$

where $$\tau_a = R_L \cdot C_L,$$

$$\tau_b = (R_f + R_L) \cdot C_L$$

and $$A_n = \frac{R_f}{R_g}.$$

The output filter function G can be written as:

$$G(s) = \frac{Z_L}{Z_L \cdot C \cdot L \cdot s^2 + L \cdot s + Z_L}.$$

Finally, the delay function is written as:

$$\delta(s) = e^{-s \cdot \tau_d} \approx 1 - s \cdot \tau_d$$

The system will oscillate at the frequency where the total phase shift becomes 360°. From the above, the switching frequency is found by requiring that:

$$\text{Arg}(\delta(s_{SW}) \cdot G(s_{SW}) \cdot H(s_{SW})) = 180°.$$

The Low-Frequency Gain is determined as follows. By oscillating, the comparator plus the power stage are linearized and become a gain block. To determine the gain, we need to know what the carrier looks like at the input of the comparator. It is known that the signal at the switching output stage is a square wave of amplitude $V_{CC}$ and pulsation $\omega_{SW}$. It is also known that the signal at the comparator will be an attenuated and low-pass filtered version. Due to this low-pass filtering action, the wave shape will be approximately sinusoidal, i.e., only the fundamental of the switching waveform needs to be considered. The amplitude of the carrier is thus:

$$C = V_{CC} |G(s_{SW}) \cdot H(s_{SW})|$$

The linearized gain of a class D output stage is related to the dv/dt of the carrier as:

$$A_V = \frac{4 \cdot V_{cc} \cdot f_{sw}}{\frac{\partial V}{\partial t}}$$

which becomes, for a sinusoidal carrier:

$$A_V = \frac{4 \cdot V_{cc} \cdot f_{sw}}{\omega_{sw} \cdot C} = \frac{4}{2 \cdot \pi \cdot |G(s_{sw}) \cdot h(s_{sw})|}$$

This makes the LF loop gain:

$$A_L(s) = A_V \cdot \delta(s) \cdot G(s) \cdot H(s)$$

and the LF closed loop gain:

$$A_{CL}(s) = \frac{A_V \cdot \delta(s) \cdot G(s)}{1 + A_L(s)}$$

As expected, the DC closed loop gain reduces to:

$$A_{CL}(0) = \frac{A_V}{1 + A_V \cdot H(0)} \approx 1 + \frac{R_f}{R_g}$$

The output impedance is the parallel impedance of the output filter divided by the loop gain:

$$Z_O(s) = \frac{1}{\left(\frac{1}{Z_L} + s \cdot C + \frac{1}{s \cdot L}\right) \cdot A_L(s)}.$$

Figure 3:
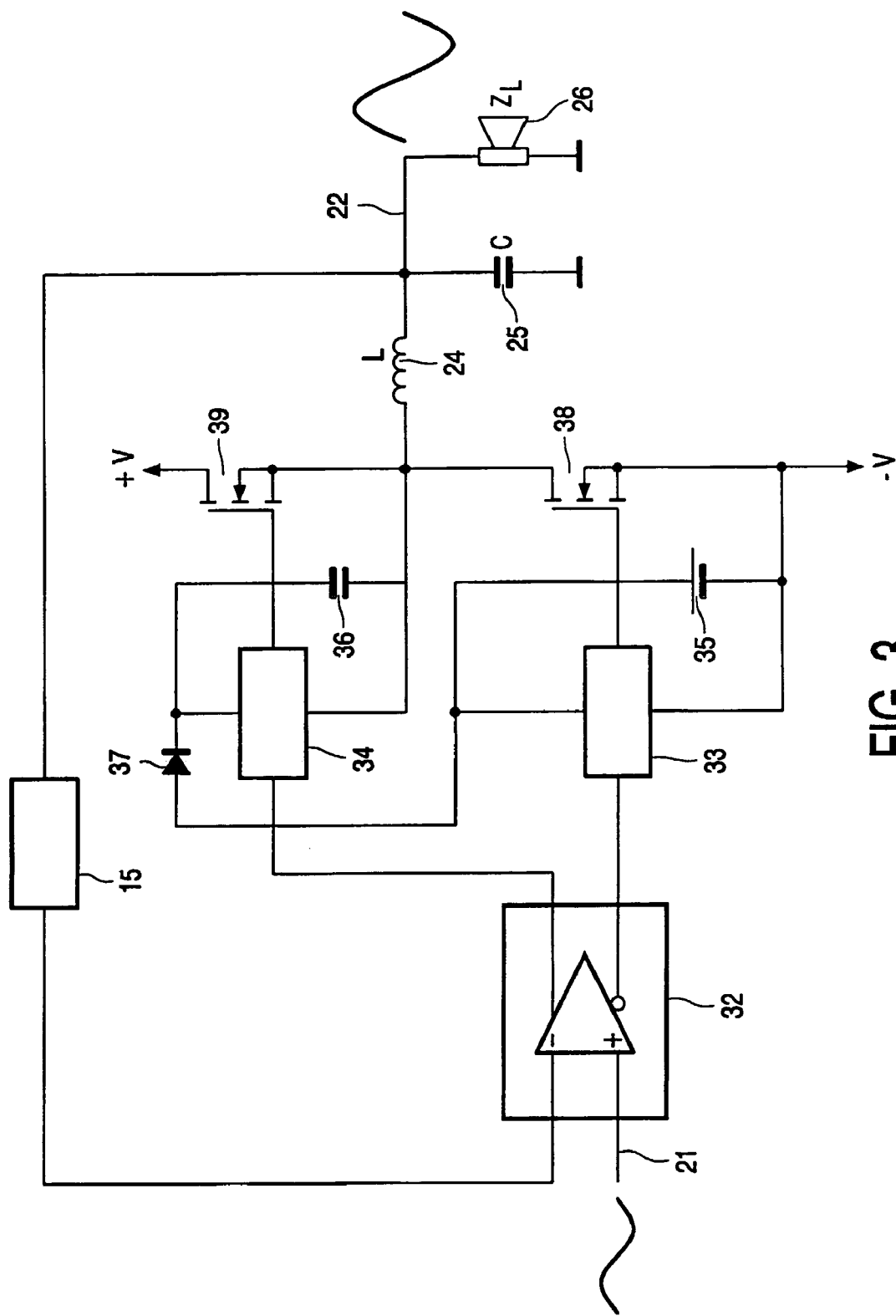
FIG. 3 shows a switching power amplifier having a comparator having complementary outputs and identical switching units.

FIG. 3 shows a switching power amplifier having a comparator having complementary outputs and identical switching units. The basic configuration is described above with reference to FIGS. 1 and 2. The amplifier circuit is shown in more detail as follows. The input stage is constituted by a comparator 32 having a positive and negative differential input. The comparator 32 has two complementary outputs coupled to switching units 33 and 34. The switching unit 33 drives a MOSFET semiconductor power switch 38 and derives its power supply from a power supply unit 35. The power supply unit 35 is referenced to the negative power supply voltage –V and may be a capacitor arrangement which derives its positive supply voltage from the ground level or from the positive power supply voltage +V. The switching unit 34 drives a second MOSFET semiconductor power switch 39 and derives its power supply from a power supply unit 36. The power supply unit 36 is floating and has its reference on the block wave signal output and may be a capacitor arrangement which derives its positive supply voltage via a bootstrap diode 37 from the power supply unit 35.

Figure 4:
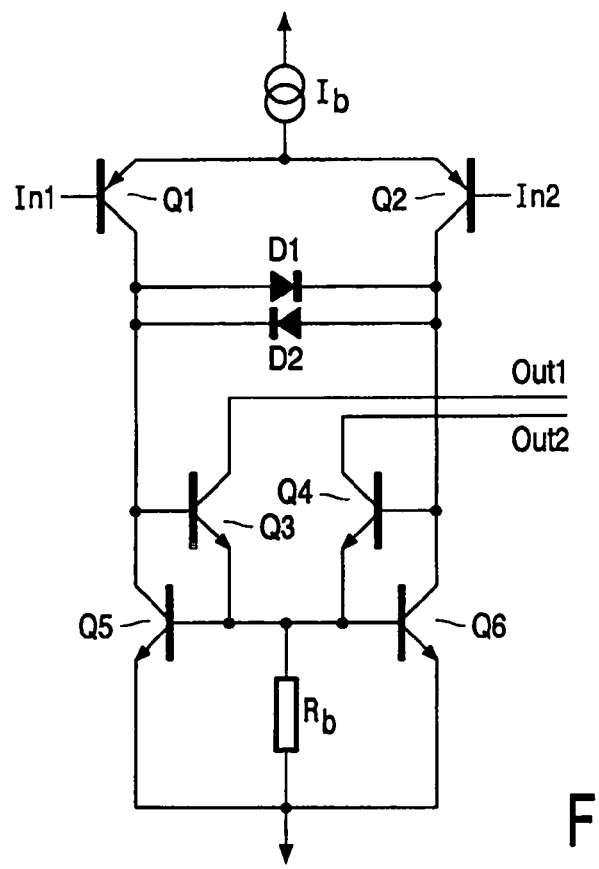
FIG. 4 shows a comparator having complementary outputs.

FIG. 4 shows a comparator having complementary outputs. The comparator has positive and negative inputs In1 and In2. A first comparator branch is constituted by transistor Q1 in series with Q5, and has an output Out1 from transistor Q3. A second comparator branch, in a mirror configuration, is constituted by transistor Q2 in series with Q6, and has an output Out2 from transistor Q4. Both branches have a common current source Ib as a power supply and a common resistor $R_b$ for the mirroring, and two limiting diodes D1 and D2 between the collectors of Q1 and Q2. $R_b$ is used to set the output current. The circuit constitutes a very simple yet fast voltage comparator with complementary current outputs. These outputs connect to two MOSFET gate drivers, one of which is floating. Q1 and Q2 form a differential amplifier, actually a differential transimpedance stage. All base currents are assumed to be negligible. Equation 1 is:

$$I_{C,Q1} + I_{C,Q2} = I_b = I_{C,Q5} + I_{C,Q6}$$

and $$I_{C,Q5} \approx I_{C,Q6}$$

Note that any deviation will cause a DC offset error. When $V_{in1} > V_{in2}$, then $I_{C,Q1} < I_{C,Q2}$. In order to maintain the equality of the bottom pair, the excess current of Q2 will be diverted through D2. This will cause $V_{B,Q4}$ to be one diode drop higher than $V_{B,Q3}$. Because of that, only Q4 will conduct to hold the bases of Q5 and Q6 at the voltage required to maintain Equation 1.

$$I_{C,Q4} = I_{Rb} = \frac{V_{BE}}{R_b} \text{ and } I_{C,Q3} = 0$$

When $V_{in1} < V_{in2}$, the converse goes. The "bottom half" of the circuit can also be seen as a current mirror of which the input and output are swapped depending on the state of the comparator. Hence, the two branches formed by Q3–Q6 and common elements Ib and $R_b$ constitute a switching current mirror. A result of this is that none of the transistors in this circuit are used in saturation, insuring high reaction speeds.

Figure 5:
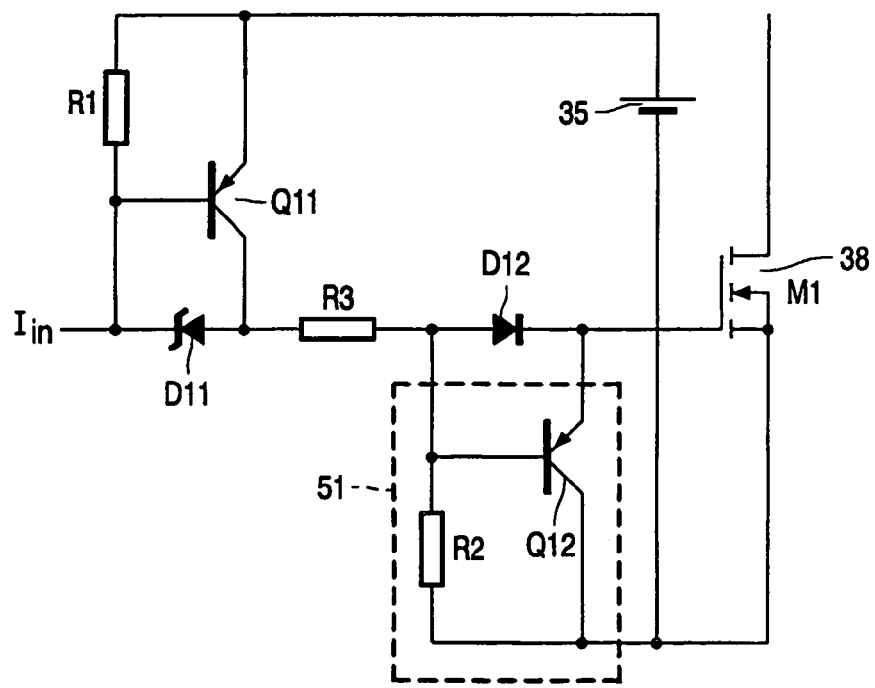
FIG. 5 shows a switching unit.

FIG. 5 shows a switching unit. The two switching units 33, 34 shown in FIG. 3 are identical. One such switching unit is shown here. A positive drive circuit is constituted by a transistor Q11 in combination with base resistor R1. The collector output of Q11 is coupled via a resistor R3 and a diode D12 to the MOSFET M1, power switch 38. A negative drive circuit is constituted by Q12 and base resistor R2 which act as an active pull-up 51. Q11 is operated as a switch with baker-clamp D11 to prevent saturation. When Q11 is turned on, a gate charge is supplied to M1 through R3 and D12. When Q11 is turned off, the gate charge is discharged by Q12+R2 which act as an "active pull-up" to speed up the discharge. Ideally, the discharge current should be about twice as large as the charge current and the circuit dimensioned accordingly. The voltage source 35 is either the supply of the low-side driver or the "bootstrap" capacitor of the high-side driver. In the latter case, charge is replenished through the bootstrap diode every time the low-side MOSFET is turned on.

Figure 6:
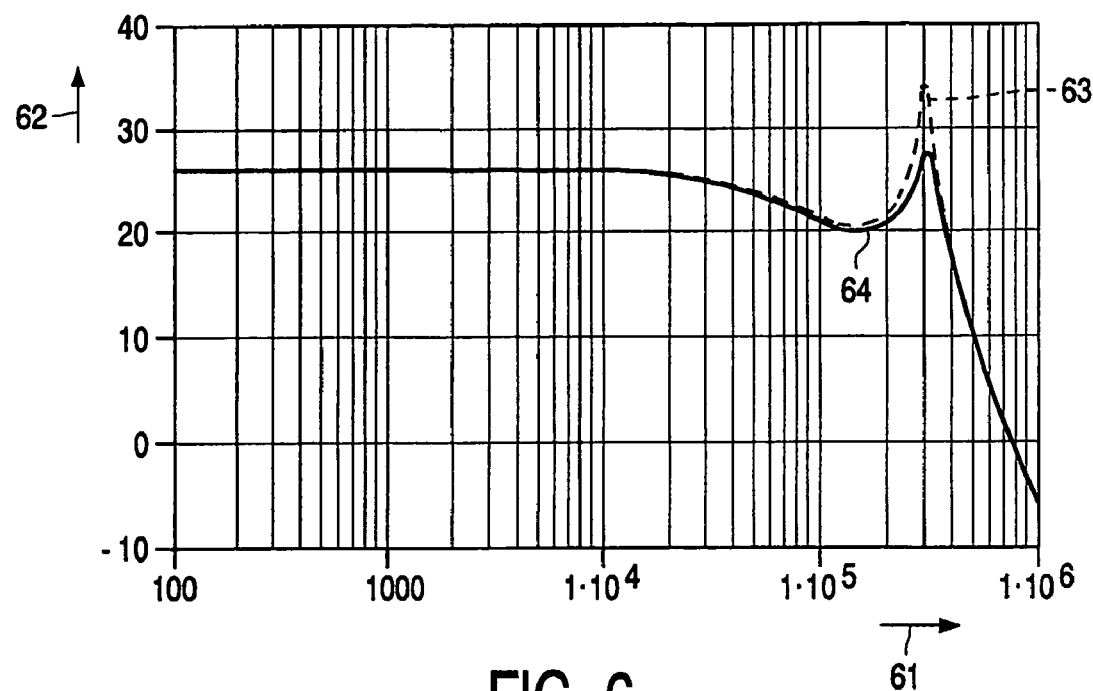
FIG. 6 shows the gain versus frequency graph.

FIG. 6 shows a gain versus frequency graph. The graph has frequency along the X-axis, indicated by arrow 61, and gain indicated by arrow 62 along the Y-axis. A first gain curve 63 indicates the gain with a load of 600Ω. A second curve 64 indicates the gain with a load of 6Ω. The amplifier circuit has been implemented according to the following requirements/boundary conditions: Power bandwidth: 35 kHz into 6Ω, Gain: 20 and $\tau_d$=200 ns. The delay $\tau_d$ is given by the implementation of the comparator and driver stage. The output filter is chosen to cut off at 35 kHz with a Q just over 0.7 to insure no attenuation occurs below cut-off by L=30 µH, C=680 nF and $Z_L$=6Ω. A DC gain of approximately 20 is given by $R_f$=4.7 kΩ and $R_g$=220Ω. Switching frequency is chosen as at least ten times power bandwidth: $f_{SW}$>350 kHz. This requirement is met by the combination $R_L$=910Ω and $C_L$=560 pF. Oscillation frequency $f_{SW}$ becomes 415 kHz and linearized gain $A_V$ becomes 457. The closed-loop gain against frequency is shown in FIG. 6. The gain shows a peak at the switching frequency, but as the amplifier is already oscillating at this frequency, this peak has little meaning. Meaningful is the remaining portion of the graph, which shows that the gain is just over 26 dB and that a 1$^{st}$ order roll off occurs at 60 kHz. Regardless of the load impedance, the physical corner frequency of the filter does not manifest itself.

Figure 7:
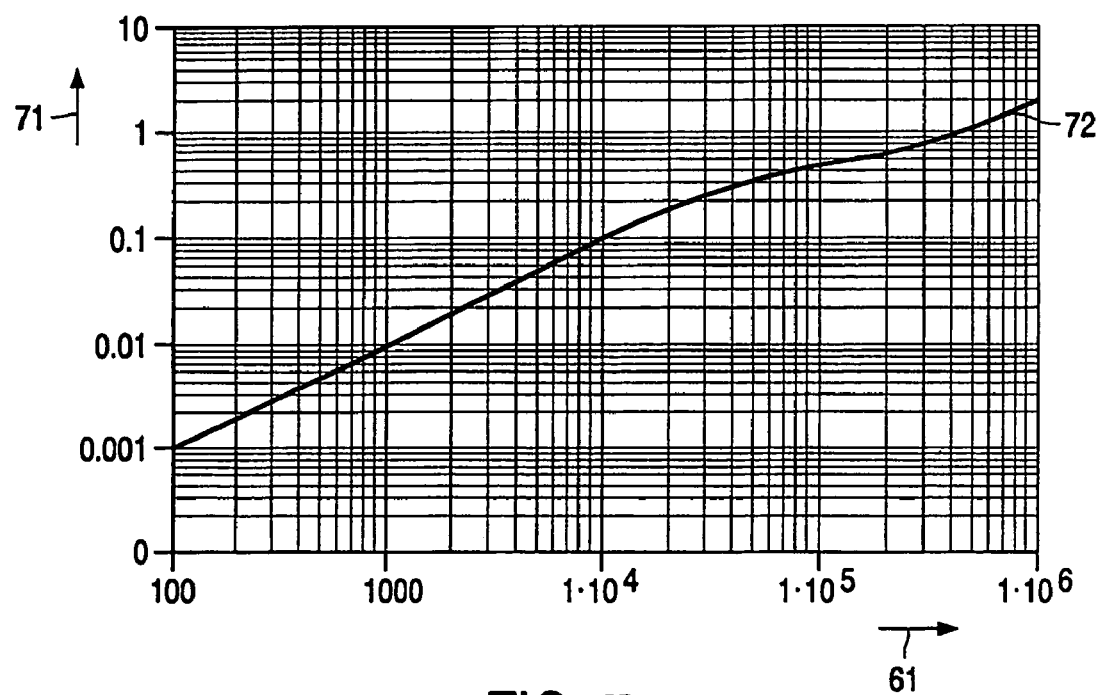
FIG. 7 shows the output impedance versus frequency graph.

FIG. 7 shows the output impedance versus frequency graph. The graph has frequency along the X-axis, indicated by arrow 61, and output impedance indicated by arrow 71 along the Y-axis. An output impedance curve 72 indicates the output impedance. The output impedance curve 72 shows no trace of the impedance of the output filter, which should be infinite at the cut-off frequency. In fact, at 35 kHz, it is 0.3Ω, and at 20 kHz, it is 0.2Ω, which is a very good result. The output impedance translates into an equivalent output inductance of 1.6 µH. This is less than the inductances commonly inserted at the output of linear amplifiers. It may be said that this control method solves one of the biggest problems in class D, to guarantee a flat frequency response across a wide range of loads.

Although the invention has been explained mainly by embodiments using an audio class D amplifier, similar embodiments are suitable for other power control systems, for example, industrial control amplifiers. It is noted, that in this document, the word 'comprising' does not exclude the presence of elements or steps other than those listed, and the word 'a' or 'an' preceding an element does not exclude the presence of a plurality of such elements, that any reference signs do not limit the scope of the claims, that the invention may be implemented by means of both hardware and software, and that several 'means' may be represented by the same item of hardware. Further, the scope of the invention is not limited to the embodiments, and the invention lies in each and every novel feature or combination of features described above.

The invention claimed is:

1. A power amplifier for amplifying an electric signal in an operational frequency range, said power amplifier comprising:
    switching means for generating a block wave signal by alternately switching the block wave signal to a first supply voltage or a second supply voltage;
    filter means for generating a power output signal by low-pass filtering the block wave signals;
    input means for receiving the electric signal and driving the switching means; and
    a control circuit coupled to the output power signal and the input means for controlling the power amplifier, characterized in that the control circuit is connected between the power output signal and a linear input of the input means for controlling both the gain in the operational frequency range and said alternately switching of the switching means, and said linear input is substantially free of hysteresis.

2. The power amplifier as claimed in claim 1, wherein the control circuit only has a voltage feedback from the power output signal.

3. The power amplifier as claimed in claim 2, wherein the control circuit comprises a first element, in the form of a resistor, for controlling said gain and a second element, in the form of a capacitance in series with a resistor, for controlling said alternately switching.

4. The power amplifier as claimed in claim 1, wherein the filter means comprises a self-inductance and a capacitance.

5. The power amplifier as claimed in claim 1, wherein the switching means comprises a first switching unit for switching to the first supply voltage and a second switching unit for switching to the second supply voltage, and the input means comprises a voltage comparator having complementary current outputs for respectively driving the first and second switching units.

6. The power amplifier as claimed in claim 5, wherein the voltage comparator comprises a difference amplifier and a switching current mirror providing said complementary current outputs.

7. The power amplifier as claimed in claim 1, wherein the switching means comprises a first switching unit for switching to the first supply voltage and a second switching unit for switching to the second supply voltage, both said first and second switching units being substantially identical.

8. The power amplifier as claimed in claim 7, wherein one of the switching units is floating with respect to said first and second supply voltages, and derives power from a bootstrap diode power circuit.

9. The power amplifier as claimed in claim 1, wherein the switching means comprises a driver circuit for a MOSFET type power switch, the circuit including an active pull-up circuit for discharging a gate of said power switch.

10. A power amplifier circuit, for use in the power amplifier as claimed in claim 1, for amplifying an electric signal in an operational frequency range, the power amplifier circuit comprising:
    switching means for generating a block wave signal by alternately switching the electric signal to a first supply voltage or a second supply voltage; and
    input means for receiving the electric signal and driving the switching means,
characterized in that the input means has a linear input for connecting a controlling circuit for controlling both the gain in the operational frequency range and also said alternately switching of the switching means, said controlling circuit being connected between the linear input and a power output signal generated by low-pass filtering the block wave signal, said linear input being substantially free of hysteresis.

* * * * *